(12) United States Patent
Lai et al.

(10) Patent No.: US 9,973,104 B2
(45) Date of Patent: May 15, 2018

(54) POWER MODULE

(71) Applicant: DELTA ELECTRONICS INT'L (SINGAPORE) PTE LTD, Singapore (SG)

(72) Inventors: Yiu-Wai Lai, Singapore (SG); Da-Jung Chen, Singapore (SG)

(73) Assignee: DELTA ELECTRONICS, INT'L (SINGAPORE) PTE LTD, Singamore (SG)

( * ) Notice: Subject to any disclaimer, the term of this patent is extended or adjusted under 35 U.S.C. 154(b) by 11 days.

(21) Appl. No.: 15/291,284

(22) Filed: Oct. 12, 2016

(65) Prior Publication Data

US 2017/0110978 A1 Apr. 20, 2017

(30) Foreign Application Priority Data

Oct. 14, 2015 (SG) .............................. 10201508520P

(51) Int. Cl.
*H02M 7/00* (2006.01)
*H01L 25/18* (2006.01)
(Continued)

(52) U.S. Cl.
CPC ........ *H02M 7/003* (2013.01); *H01L 23/3675* (2013.01); *H01L 23/49531* (2013.01); *H01L 23/49562* (2013.01); *H01L 23/49568* (2013.01); *H01L 23/49575* (2013.01); *H01L 23/49827* (2013.01); *H01L 23/49838* (2013.01);
(Continued)

(58) Field of Classification Search
CPC ........ H02M 7/003; H02M 7/219; H02M 7/06; H05K 7/209; H05K 1/115; H05K 1/185; H05K 1/0204; H01L 25/18; H01L 23/3675; H01L 23/3735; H01L 23/481; H01L 23/49562; H01L 29/7395; H01L 29/861; H01L 23/49575; H01L 23/49568; H01L 23/3114; H01L 24/24; H01L 24/40; H01L 24/49; H01L 24/73; H01L 24/82;
(Continued)

(56) References Cited

U.S. PATENT DOCUMENTS 9,107,290 B1  8/2015  Chen
2009/0016088 A1* 1/2009 Bayerer .................. H01L 24/24
363/125

(Continued)

FOREIGN PATENT DOCUMENTS

EP  2 244 288 A1  10/2010

*Primary Examiner* — Mouloucoulaye Inoussa
(74) *Attorney, Agent, or Firm* — Kirton McConkie; Evan R. Witt

(57) ABSTRACT

A power module includes a substrate, a first sub-module, a second sub-module and a circuit board. The semiconductor switches and the diodes of the first sub-module and the second sub-module are embedded within insulation layers. Consequently, the first sub-module and the second sub-module are formed as a high-voltage-side switching element and a low-voltage-side switching element of a bridge circuit. The first sub-module and the second sub-module are disposed on a first surface of the substrate. An electrode of the first sub-module and some electrodes of the second sub-module are electrically connected with corresponding conducting parts of a circuit board. A heat sink is disposed on a second surface of the substrate.

18 Claims, 10 Drawing Sheets

(51) Int. Cl.
*H01L 23/367* (2006.01)
*H01L 23/495* (2006.01)
*H01L 25/11* (2006.01)
*H01L 23/498* (2006.01)
*H01L 23/00* (2006.01)

(52) U.S. Cl.
CPC ........ *H01L 23/49861* (2013.01); *H01L 24/24* (2013.01); *H01L 25/115* (2013.01); *H01L 25/18* (2013.01); *H01L 2224/24226* (2013.01); *H01L 2924/1203* (2013.01); *H01L 2924/13055* (2013.01)

(58) Field of Classification Search
CPC ....... H01L 25/072; H01L 24/39; H01L 24/36; H01L 23/049; H01L 23/043
USPC .......... 361/728; 363/125; 257/712, E23.101, 257/E25.016; 327/530
See application file for complete search history.

(56) References Cited

U.S. PATENT DOCUMENTS

| | | |
|---|---|---|
| 2010/0078783 A1 | 4/2010 | Otremba |
| 2013/0020694 A1* | 1/2013 | Liang .................... H01L 25/072 257/691 |
| 2015/0255380 A1 | 8/2015 | Chen |

* cited by examiner

POWER MODULE

FIELD OF THE INVENTION

The present invention relates to a power module, and more particularly to a power module with enhanced heat dissipating efficiency.

BACKGROUND OF THE INVENTION

Recently, the general trends in designing power converters are toward high efficiency and high density. The high efficiency power converter can reduce the power loss and achieve the power-saving purpose. The high density power converter can reduce the overall volume of the electronic product and meet the requirements of small size and light weightiness.

Generally, a power converter comprises a bridge circuit for rectification. The bridge circuit comprises at least one high-voltage-side switching element and at least one low-voltage-side switching element. For example, a three-phase bridge circuit of a three-phase power converter comprises three high-voltage-side switching elements and three low-voltage-side switching elements. The high-voltage-side switching elements are connected with the corresponding low-voltage-side switching elements in series. Each of the high-voltage-side switching elements and the low-voltage-side switching elements comprises a semiconductor switch and a diode, which are connected with each other in parallel. For example, the semiconductor switch is an insulated-gate bipolar transistor (IGBT). By alternately turning on and turning off the semiconductor switch, the bridge circuit can rectify the input power. When the semiconductor switch is turned off, the diode allows the current to continuously flow.

A conventional method of fabricating the bridge circuit of the power converter will be illustrated as follows. Firstly, the semiconductor switches and the diodes of the high-voltage-side switching elements are attached on a first substrate by solder and then wire bonded, and the semiconductor switches and the diodes of the low-voltage-side switching elements are attached on a second substrate and then wire bonded. Then, the high-voltage-side switching elements and the low-voltage-side switching elements are disposed on a circuit board. Then, the semiconductor switches and the diodes of the high-voltage-side switching elements and the semiconductor switches and the diodes of the low-voltage-side switching elements are connected with each other and/or connected with an external component by a wire-bonded technology (e.g. through aluminum wires or copper wires).

However, the side of the circuit board for wire-bonding the high-voltage-side switching elements and the low-voltage-side switching elements cannot be equipped with any heat sink. Since the substrate is only able to dissipate away heat in a single direction, the heat dissipating efficiency is insufficient. Moreover, since the electronic components of the high-voltage-side switching elements and the low-voltage-side switching elements are attached on the corresponding substrates by solder, the conventional method of fabricating the bridge circuit is very complicated. Moreover, the long wires for connecting the high-voltage-side switching elements and the low-voltage-side switching elements by the wire-bonded technology may increase the parasitic inductance between the wires and the circuit board. Under this circumstance, the switching efficiency and the power conversion efficiency of the high-voltage-side switching elements and the low-voltage-side switching elements are adversely affected.

Therefore, there is a need of providing an improved power module so as to overcome the above drawbacks.

SUMMARY OF THE INVENTION

An object of the present invention provides a power module with semiconductor switches and diodes embedded within insulation layers. Consequently, a first sub-module and a second sub-module are formed as a high-voltage-side switching element and a low-voltage-side switching element of a bridge circuit. The first sub-module and the second sub-module are disposed on a first surface of a substrate. An electrode of the first sub-module and some electrodes of the second sub-module are electrically connected with corresponding conducting parts of a circuit board. A heat sink is disposed on a second surface of the substrate. Consequently the power module of the present invention has enhanced heat dissipating efficiency, simplified fabricating process, increased switching efficiency and increased power conversion efficiency.

In accordance with an aspect of the present invention, there is provided a power module. The power module includes a substrate, a first sub-module, a second sub-module, a conductive pin, a circuit board and a heat sink. The substrate comprises a first conductive layer disposed on a first surface and a second conductive layer disposed on a second surface opposite to the first surface. The first conductive layer comprises a plurality of conductive blocks. The first sub-module is disposed on the first conductive layer, and the first sub-module comprises a first semiconductor switch and a first diode which is connected in parallel with the first semiconductor switch. The second sub-module is disposed on the first conductive layer, and the second sub-module comprises a second semiconductor switch and a second diode which is connected in parallel with the second semiconductor switch. The second semiconductor switch is electrically connected with the first semiconductor switch through the plurality of conductive blocks. The conductive pin is disposed on the first conductive layer and electrically connected with at least one of the conductive blocks. The circuit board is disposed on the conductive pin and electrically connected with the first semiconductor switch and the second semiconductor switch through the conductive pin. The heat sink is disposed on the second conductive layer.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
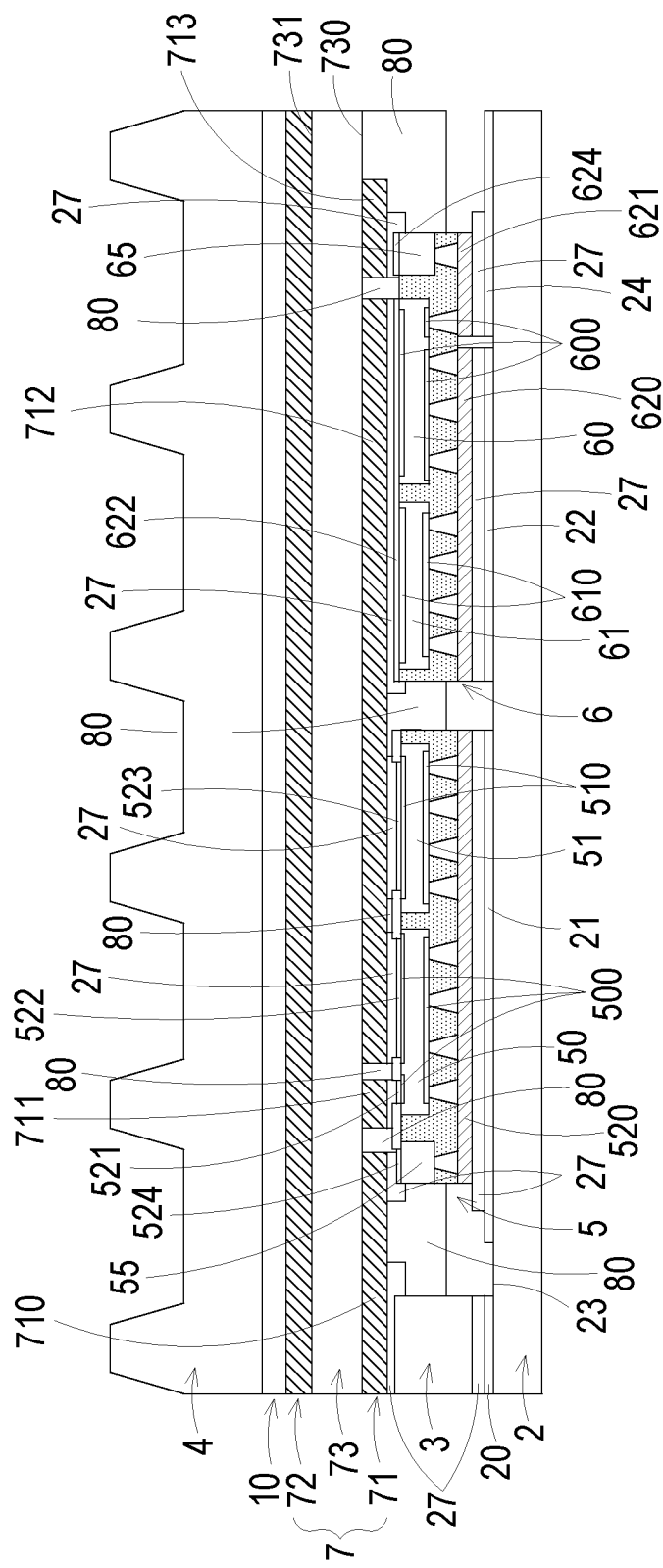
FIG. 1 is a schematic perspective view illustrating a power module according to an embodiment of the present invention.

FIG. 1 is a schematic perspective view illustrating a power module according to an embodiment of the present invention. As shown in FIG. 1, the power module 1 comprises a circuit board 2, a conductive pin 3, a heat sink 4, a first sub-module 5, a second sub-module 6 and a substrate 7. The conductive pin 3 is an individual pin that can be soldered.

The first sub-module 5 comprises a first semiconductor switch 50, a first diode 51, a first electrode 520, a second electrode 521, a third electrode 522, a fourth electrode 523, a first thermal/electrical conduction structure 55 and a first lead electrode 524. The first electrode 520 is located at a first side of the first sub-module 5. The second electrode 521, the third electrode 522, the fourth electrode 523 and the first lead electrode 524 are located at a second side of the first sub-module 5. The first semiconductor switch 50 comprises plural first conducting terminals 500. The first diode 51 comprises plural second conducting terminals 510. The first electrode 520 is electrically connected with the corresponding first conducting terminal 500 of the first semiconductor switch 50 and the corresponding second conducting terminal 510 of the first diode 51. The second electrode 521 and the third electrode 522 are electrically connected with the corresponding first conducting terminals 500 of the first semiconductor switch 50. The fourth electrode 523 is electrically connected with the corresponding second conducting terminal 510 of the first diode 51. Moreover, the first thermal/electrical conduction structure 55 is arranged between the first electrode 520 and the first lead electrode 524, and electrically connected with the first electrode 520 and the first lead electrode 524.

The third electrode 522 is arranged between the second electrode 521 and the fourth electrode 523. The first lead electrode 524 is arranged beside the second electrode 521 and located at the outermost edge of the second side of the first sub-module 5. In an embodiment, the first semiconductor switch 50 is an insulated-gate bipolar transistor (IGBT). Consequently, the first semiconductor switch 50 comprises three first conducting terminals 500. The three first conducting terminals 500 serve as a gate, an emitter and a collector, respectively. The first electrode 520 is electrically connected with the collector. The second electrode 521 is electrically connected with the gate. The third electrode 522 is electrically connected with the emitter.

The second sub-module 6 comprises a second semiconductor switch 60, a second diode 61, a fifth electrode 620, a sixth electrode 621, a seventh electrode 622, a second thermal/electrical conduction structure 65 and a second lead electrode 624. The fifth electrode 620 and the sixth electrode 621 are located at a first side of the second sub-module 6. The seventh electrode 622 and the second lead electrode 624 are located at a second side of the second sub-module 6. The second semiconductor switch 60 comprises plural third conducting terminals 600. The second diode 61 comprises plural fourth conducting terminals 610. The fifth electrode 620 and the seventh electrode 622 are electrically connected with the corresponding third conducting terminals 600 of the second semiconductor switch 60 and the corresponding fourth conducting terminal 610 of the second diode 61. The sixth electrode 621 is electrically connected with the corresponding third conducting terminal 600 of the second semiconductor switch 60. Moreover, the second thermal/electrical conduction structure 65 is arranged between the sixth electrode 621 and the second lead electrode 624, and electrically connected with the sixth electrode 621 and the second lead electrode 624.

In an embodiment, the second semiconductor switch 60 is an insulated-gate bipolar transistor (IGBT). Consequently, the second semiconductor switch 60 comprises three third conducting terminals 600. The three third conducting terminals 600 serve as a gate, an emitter and a collector, respectively. The fifth electrode 620 is electrically connected with the emitter. The sixth electrode 621 is electrically connected with the gate. The seventh electrode 622 is electrically connected with the collector.

The substrate 7 comprises a first conductive layer 71, a second conductive layer 72 and an insulation layer 73. The first conductive layer 71 is disposed on a first surface 730 of the insulation layer 73. The second conductive layer 72 is disposed on a second surface 731 of the insulation layer 73. The first surface 730 is opposite to the second surface 731. The first conductive layer 71 is electrically connected with the second electrode 521, the third electrode 522, the fourth electrode 523 and the first lead electrode 524 at the second side of the first sub-module 5 and electrically connected with the seventh electrode 622 and the second lead electrode 624 at the second side of the second sub-module 6. Moreover, the first conductive layer 71 is electrically connected with a first end of the conductive pin 3.

Moreover, by an etching process, the first conductive layer 71 is divided into a plurality of conductive blocks including a first conductive block 710, a second conductive block 711, a third conductive block 712 and a fourth conductive block 713. The first conductive block 710 is electrically connected with the first end of the conductive pin 3 and the first lead electrode 524. The second conductive block 711 is electrically connected with the second electrode 521. The third conductive block 712 is electrically connected with the third electrode 522, the fourth electrode 523 and the seventh electrode 622. The fourth conductive block 713 is electrically connected with the second lead electrode 624. The conductive pin 3, the electrodes of the first sub-module 5 and the electrodes of the second sub-module 6 are fixed on the conductive blocks of the first conductive layer 71 through conducting materials 27 (e.g. solder paste, silver paste, silver sintering paste). The insulation layer 73 is made of insulation material with high thermal conductivity (e.g. ceramic material).

In an embodiment, the conductive pin 3, the first sub-module 5 and the second sub-module 6 are separately disposed on the first conductive layer 71 of the substrate 7. Moreover, the spaces between the first conductive layer 71 of the substrate 7, the conductive pin 3, the first sub-module 5 and the second sub-module 6 are filled with isolation structures 80. These isolation structures 80 are made of isolation material (e.g. under-fill epoxy, molding compound).

Moreover, a heat sink 4 is disposed on the second conductive layer 72 of the substrate 7. Consequently, the heat dissipating efficacy of the first sub-module 5 and the second sub-module 6 will be enhanced. In some embodiments, the power module 1 further comprises a thermally-conductive insulation layer 10. The thermally-conductive insulation layer 10 is arranged between the heat sink 4 and the second conductive layer 72. The heat from the second conductive layer 72 is transferred to the heat sink 4 through the thermally-conductive isolation layer 10. Moreover, the second conductive layer 72 and the heat sink 4 are isolated from each other through the thermally-conductive isolation layer 10.

The circuit board 2 is disposed on the conductive pin 3 and electrically connected with the first semiconductor switch 50 and the second semiconductor switch 60 via the conductive pin 3. In this embodiment, the circuit board 2 comprises a first conducting part 20, a second conducting part 21, a third conducting part 22 and a fourth conducting part 24. The first conducting part 20, the second conducting part 21, the third conducting part 22 and the fourth conducting part 24 are disposed on a first surface 23 of the circuit board 2. The first conducting part 20 is electrically connected with a second end of the conductive pin 3. The second conducting part 21 is electrically connected with the first electrode 520 of the first sub-module 5. The third conducting part 22 is electrically connected with the fifth electrode 620 of the second sub-module 6. The fourth conducting part 24 is electrically connected with the sixth electrode 621 of the second sub-module 6. Preferably, the second end of the conductive pin 3, the first electrode 520, the fifth electrode 620 and the sixth electrode 621 are respectively fixed on the first conducting part 20, the second conducting part 21, the third conducting part 22 and the fourth conducting part 24 of the circuit board 2 through the conducting materials 27. The first conducting part 20, the second conducting part 21, the third conducting part 22 and the fourth conducting part 24 are made of electrically-conductive material such as copper. Moreover, the first conducting part 20 is electrically connected with the first electrode 520 through the conductive pin 3, the first conductive block 710 and the first thermal/electrical conduction structure 55.

Figure 2:
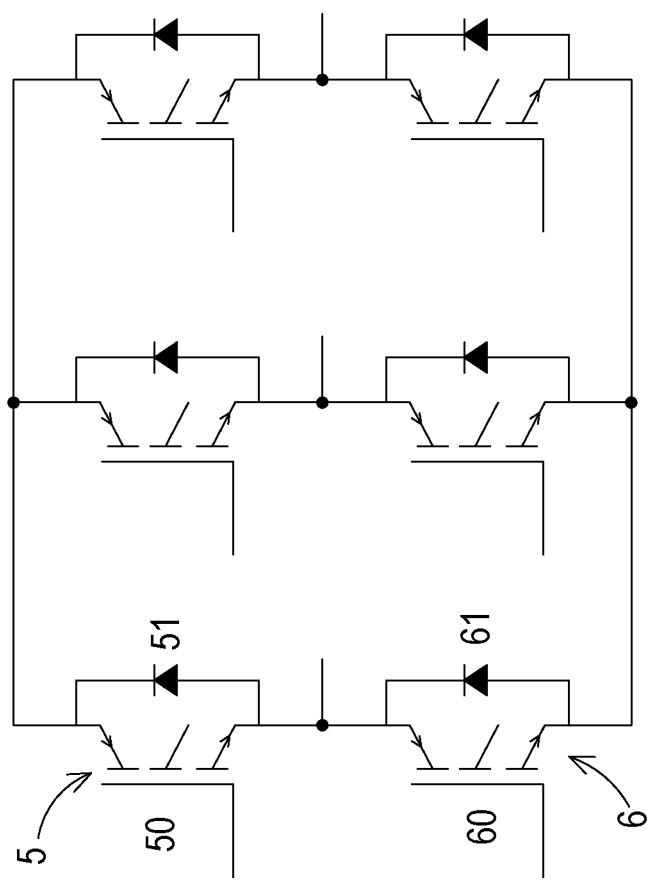
FIG. 2 is a schematic circuit diagram illustrating a three-phase bridge circuit of a three-phase power converter with the power module of FIG. 1.

FIG. 2 is a schematic circuit diagram illustrating a three-phase bridge circuit of a three-phase power converter with the power module of FIG. 1. In case that the power module 1 is applied to the three-phase power converter, the power module 1 comprises three first sub-modules 5 and three second sub-modules 6. Each first sub-module 5 and the corresponding second sub-module 6 are collaboratively formed as one leg of the three-phase bridge circuit. Moreover, the first sub-module 5 is formed as a high-voltage-side switching element, and the second sub-module 6 is formed as a low-voltage-side switching element. The first semiconductor switch 50 and the first diode 51 are connected in parallel. The second semiconductor switch 60 and the second diode 61 are connected in parallel, and the second semiconductor switch 60 is electrically connected with the first semiconductor switch 50 via the conductive blocks. In each leg of the bridge circuit, the emitter of the high-voltage-side switching element is electrically connected with the collector of the low-voltage-side switching element. Moreover, as mentioned above, the third electrode 522 of the first sub-module 5 and the seventh electrode 622 of the second sub-module 6 are contacted with the third conductive block 712, the third electrode 522 is electrically connected with the emitter of the first semiconductor switch 50, and the seventh electrode 622 is electrically connected with the collector of the second semiconductor switch 60. In other words, the emitter of the high-voltage-side switching element (i.e. the first sub-module 5) is electrically connected with the collector of the low-voltage-side switching element (i.e. the second sub-module 6).

Figure 3:
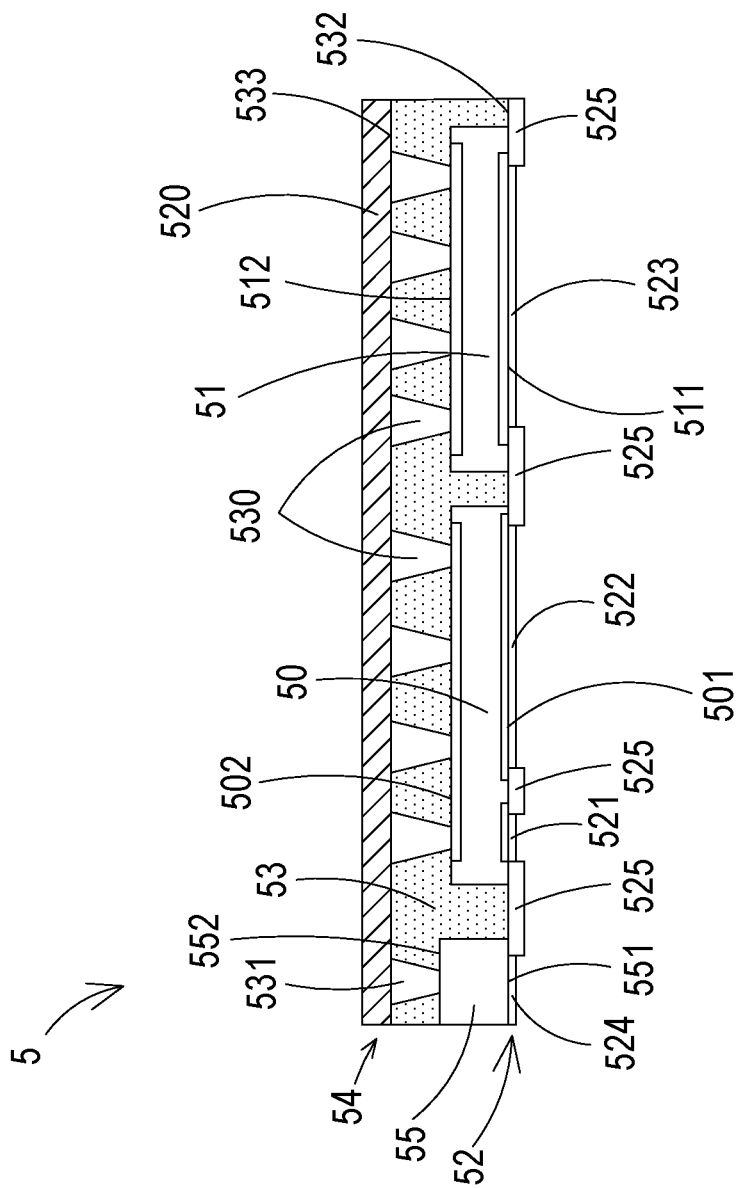
FIG. 3 is a schematic cross-sectional view illustrating an exemplary first sub-module of the power module of FIG. 1.
Figure 4:
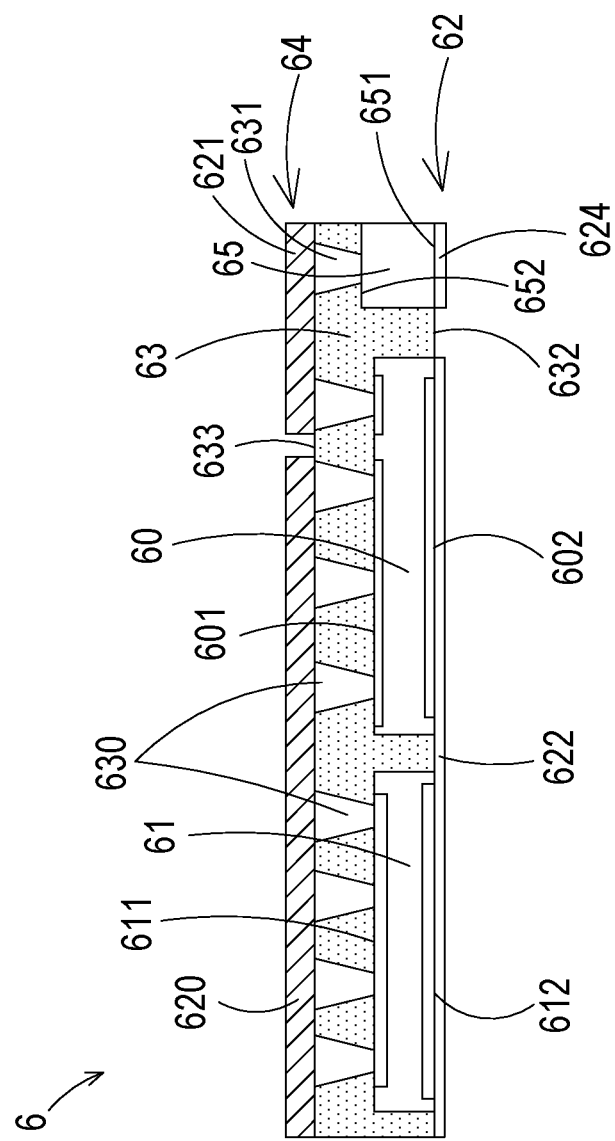
FIG. 4 is a schematic cross-sectional view illustrating an exemplary second sub-module of the power module of FIG. 1.

FIG. 3 is a schematic cross-sectional view illustrating an exemplary first sub-module of the power module of FIG. 1. FIG. 4 is a schematic cross-sectional view illustrating an exemplary second sub-module of the power module of FIG. 1. The first sub-module 5 of FIG. 3 and the second sub-module 6 of FIG. 4 are mirror-inverted to the first sub-module 5 and the second sub-module 6 of FIG. 1.

The first sub-module 5 comprises the first semiconductor switch 50, the first diode 51, a first conductive layer 52, a first insulation layer 53, a second conductive layer 54 and the first thermal/electrical conduction structure 55.

Moreover, plural first conductive vias 530 and a second conductive via 531 are formed in the first insulation layer 53. The first conductive layer 52 is disposed on a first surface 532 of the first insulation layer 53, and made of electrically-conductive material such as copper. Moreover, the first conductive layer 52 comprises plural separation structures 525. For example, the separation structures 525 are made of solder mask material or polyimide. The first conductive layer 52 is divided into the second electrode 521, the third electrode 522, the fourth electrode 523 and the first lead electrode 524 through the plural separation structures 525. The second conductive layer 54 is disposed on a second surface 533 of the first insulation layer 53, and made of electrically-conductive material such as copper. The second conductive layer 54 is formed as the first electrode 520. Moreover, the second conductive layer 54 (i.e., the first electrode 520) is contacted with first ends of the plural first conductive vias 530, and contacted with a first end of the second conductive via 531.

The first semiconductor switch 50 is embedded within the first insulation layer 53. The first conducting terminal 500 serving as the gate of the first semiconductor switch 50 and the first conducting terminal 500 serving as the emitter of the first semiconductor switch 50 are disposed on the top surface 501 of the first semiconductor switch 50. The first conducting terminal 500 serving as the collector of the first semiconductor switch 50 is disposed on a second surface 502 of the first semiconductor switch 50. Moreover, the gate of the first semiconductor switch 50 is electrically connected with the second electrode 521. The emitter of the first semiconductor switch 50 is electrically connected with the third electrode 522. The collector of the first semiconductor switch 50 is contacted with second ends of the corresponding first conductive vias 530, and electrically connected with the first electrode 520 through the corresponding first conductive vias 530.

Similarly, the first diode 51 is embedded within the first insulation layer 53. The second conducting terminal 510 on a first surface 511 of the first diode 51 serves as an anode. Moreover, the anode of the first diode 51 is electrically connected with the fourth electrode 523. The second conducting terminal 510 on a second surface 512 of the first diode 51 serves as a cathode. Moreover, the cathode of the first diode 51 is contacted with the second ends of the corresponding first conductive vias 530, and electrically connected with the first electrode 520 through the corresponding first conductive vias 530.

The first thermal/electrical conduction structure 55 is made of metallic material. Moreover, the first thermal/electrical conduction structure 55 may be implemented with the same lead frame or two different lead frames. Consequently, the first thermal/electrical conduction structure 55 has thermally conductive property and electrically conductive property. The first thermal/electrical conduction structure 55 is also embedded within the first insulation layer 53, and partially exposed outside the first insulation layer 53. The first thermal/electrical conduction structure 55 has a first surface 551 and a second surface 552. The first surface 551 of the first thermal/electrical conduction structure 55 is contacted with the first lead electrode 524. The second surface 552 of the first thermal/electrical conduction structure 55 is contacted with a second end of the second conductive via 531, and electrically connected with the first electrode 520.

The second sub-module 6 comprises the second semiconductor switch 60, the second diode 61, a third conductive layer 62, a second insulation layer 63, a fourth conductive layer 64 and the second thermal/electrical conduction structure 65. Moreover, plural third conductive vias 630 and a fourth conductive vias 631 are formed in the second insulation layer 63. The third conductive layer 62 is disposed on a first surface 632 of the second insulation layer 63. The third conductive layer 62 is divided into the seventh electrode 622 and the second lead electrode 624 by an etching process. The fourth conductive layer 64 is disposed on a second surface 633 of the second insulation layer 63. The fourth conductive layer 64 is divided into the fifth electrode 620 and the sixth electrode 621 by an etching process. The fifth electrode 620 and the sixth electrode 621 are contacted with first ends of the third conductive vias 630. Moreover, the sixth electrode 621 is further contacted with a first end of the fourth conductive via 631.

The second semiconductor switch 60 is embedded within the second insulation layer 63. The third conducting terminals 600 serving as the gate and the emitter of the second semiconductor switch 60 are disposed on a first surface 601 of the second semiconductor switch 60. The third conducting terminal 600 serving as the collector is disposed on a second surface 602 of the second semiconductor switch 60. The emitter of the second semiconductor switch 60 is contacted with second ends of the corresponding third conductive vias 630 and electrically connected with the fifth electrode 620. The gate of the second semiconductor switch 60 is contacted with second ends of the corresponding third conductive vias 630, and electrically connected with the sixth electrode 621. The collector of the second semiconductor switch 60 is electrically connected with the seventh electrode 622.

Similarly, the second diode 61 is embedded within the second insulation layer 63. The fourth conducting terminal 610 on a first surface 611 of the second diode 61 serves as anode. Moreover, the anode of the second diode 61 is contacted with the second ends of the corresponding third conductive vias 630, and electrically connected with the fifth electrode 620. The fourth conducting terminal 610 on a second surface 612 of the second diode 61 serves as a cathode. Moreover, the cathode of the second diode 61 is electrically connected with the seventh electrode 622.

The second thermal/electrical conduction structure 65 is also embedded within the second insulation layer 63, and partially exposed outside the second insulation layer 63. The second thermal/electrical conduction structure 65 has a first surface 651 and a second surface 652. The first surface 651 of the second thermal/electrical conduction structure 65 is contacted with the second lead electrode 624. The second surface 652 of the second thermal/electrical conduction structure 65 is contacted with a second end of the fourth conductive via 631, and electrically connected with the sixth electrode 621.

As shown in FIGS. 1, 3 and 4, the configurations of the first semiconductor switch 50 and the second semiconductor switch 60 are similar, and the configurations of the first diode 51 and the second diode 61 are similar. The first semiconductor switch 50 within the first insulation layer 53 and the second semiconductor switch 60 within the second insulation layer 63 are inverted relative to each other. Moreover, the first diode 51 within the first insulation layer 53 and the second diode 61 within the second insulation layer 63 are inverted relative to each other.

Figure 5A:
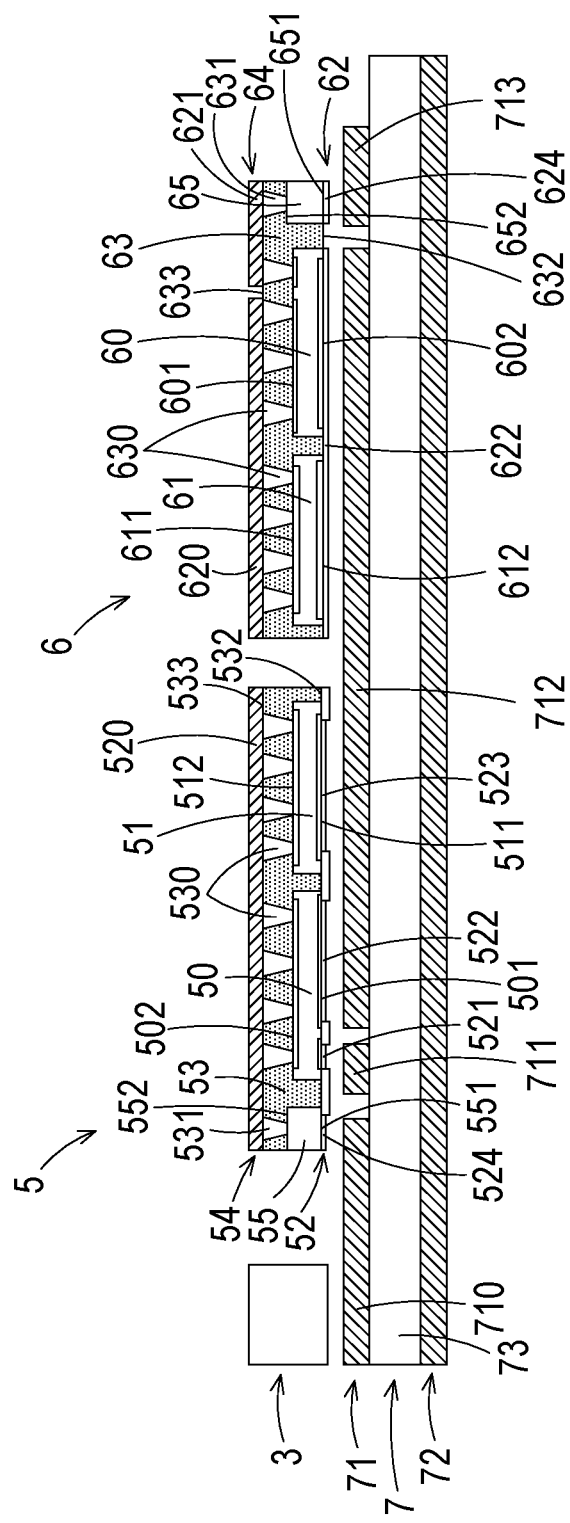
FIGS. 5A-5D are schematic cross-sectional views illustrating the steps of packaging the power module 1 of FIG. 1.
Figure 5B:
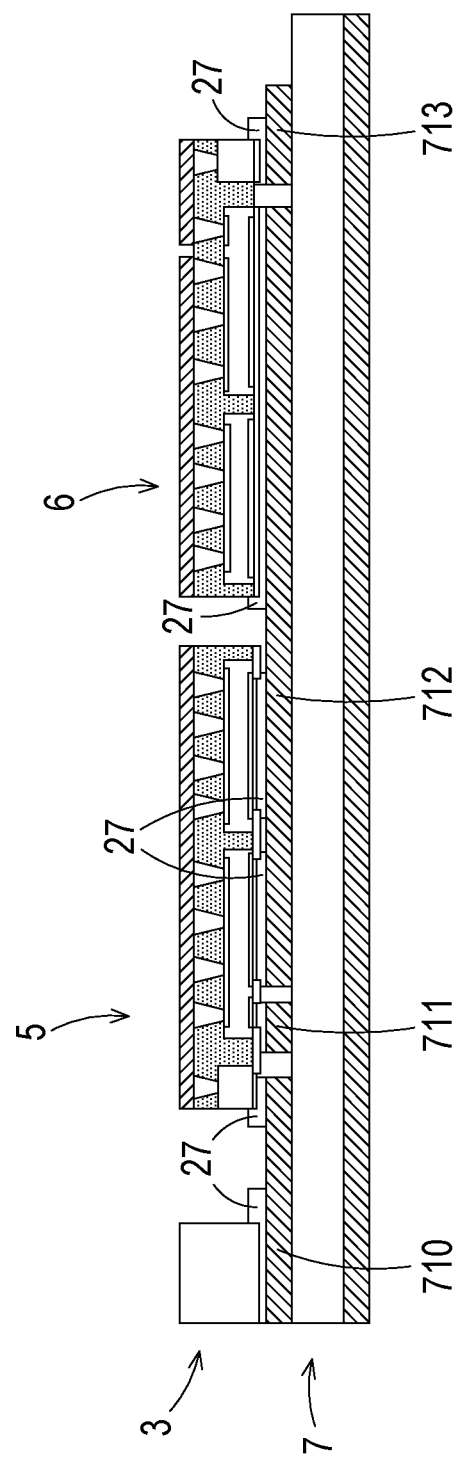

Hereinafter, a process of packaging the power module 1 of FIG. 1 will be illustrated with reference to FIGS. 5A-5D. FIGS. 5A-5D are schematic cross-sectional views illustrating the steps of packaging the power module 1 of FIG. 1. Firstly, as shown in FIGS. 5A and 5B, the substrate 7 is provided. Then, through the conducting material 27, the first end of the conductive pin 3 and the first lead electrode 524 are fixed on the first conductive block 710, the second electrode 521 is fixed on the second conductive block 711, the third electrode 522, the fourth electrode 523 and the seventh electrode 622 are fixed on the third conductive block 712, and the second lead electrode 624 is fixed on the fourth conductive block 713.

Figure 5C:
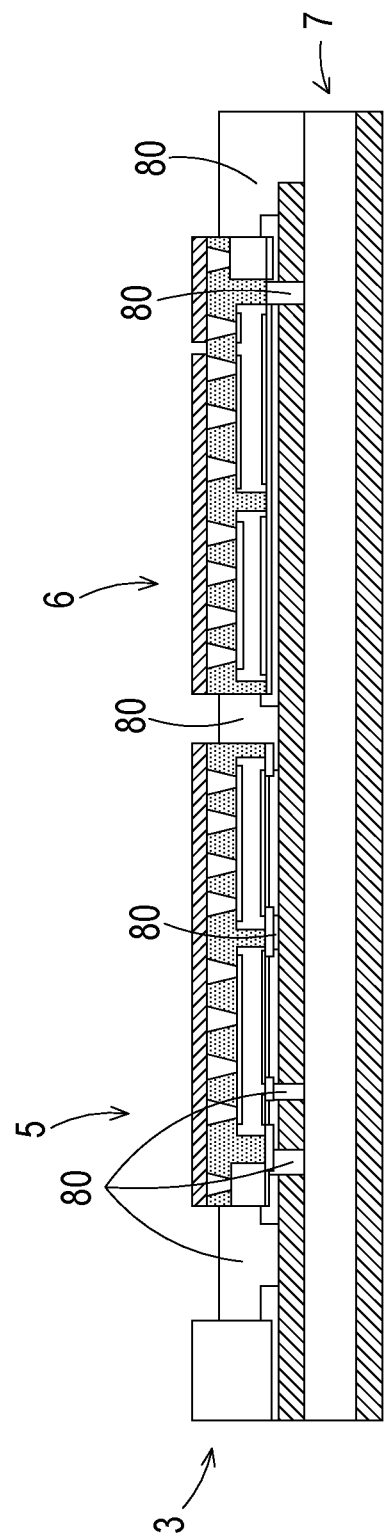

Then, as shown in FIG. 5C, the spaces between the first conductive layer 71 of the substrate 7, the conductive pin 3, the first sub-module 5 and the second sub-module 6 are filled with isolation structures 80.

Figure 5D:
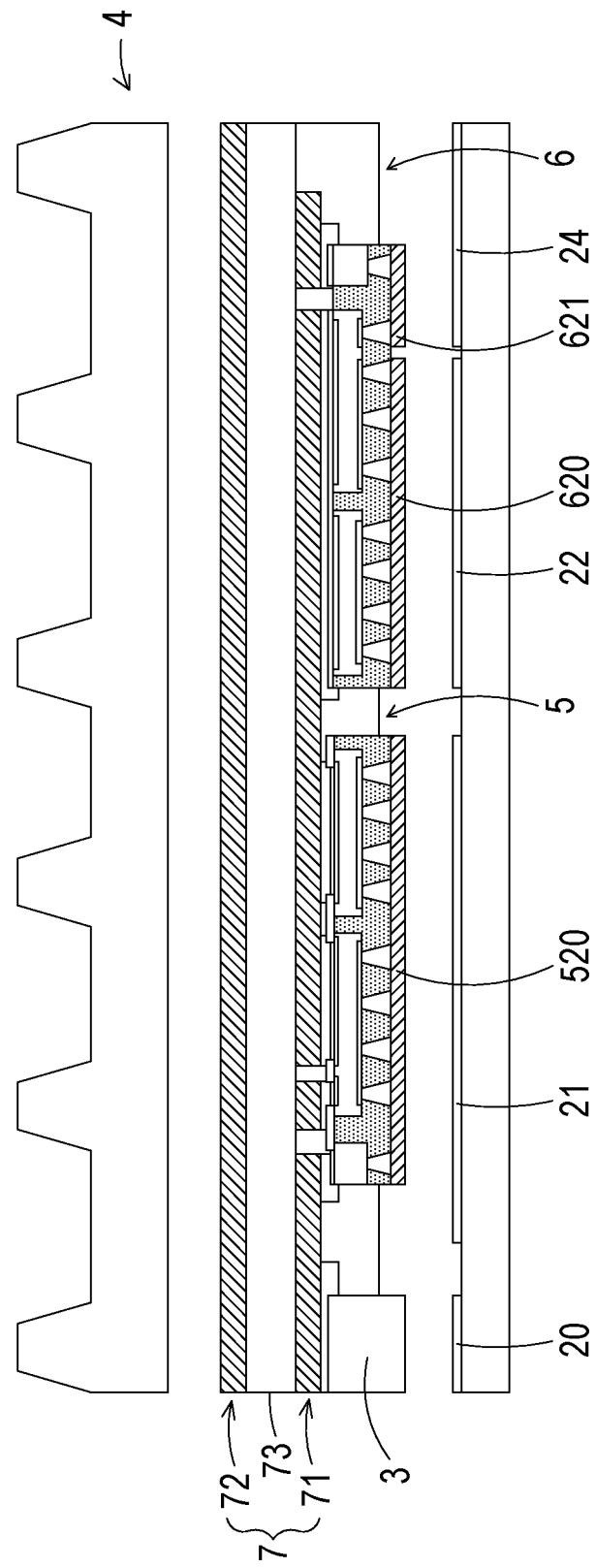

Then, as shown in FIG. 5D, the heat sink 4 is disposed on the second conductive layer 72 of the substrate 7. Optionally, the thermally-conductive insulation layer 10 is arranged between the heat sink 4 and the second conductive layer 72. Moreover, through the conducting material 27, the second end of the conductive pin 3 is fixed on the first conducting part 20, the first electrode 520 of the first sub-module 5 is fixed on the second conducting part 21, the fifth electrode 620 of the second sub-module 6 is fixed on the third conducting part 22, and the sixth electrode 621 of the second sub-module 6 is fixed on the fourth conducting part 24. Meanwhile, the power module 1 of FIG. 1 is fabricated.

It is noted that numerous modifications and alterations of the power module may be made while retaining the teachings of the invention. Hereinafter, two variant examples of the power module 1 will be illustrated with reference to FIGS. 6 and 7. Component parts and elements corresponding to those of the first embodiment are designated by identical numeral references, and detailed descriptions thereof are omitted.

Figure 6:
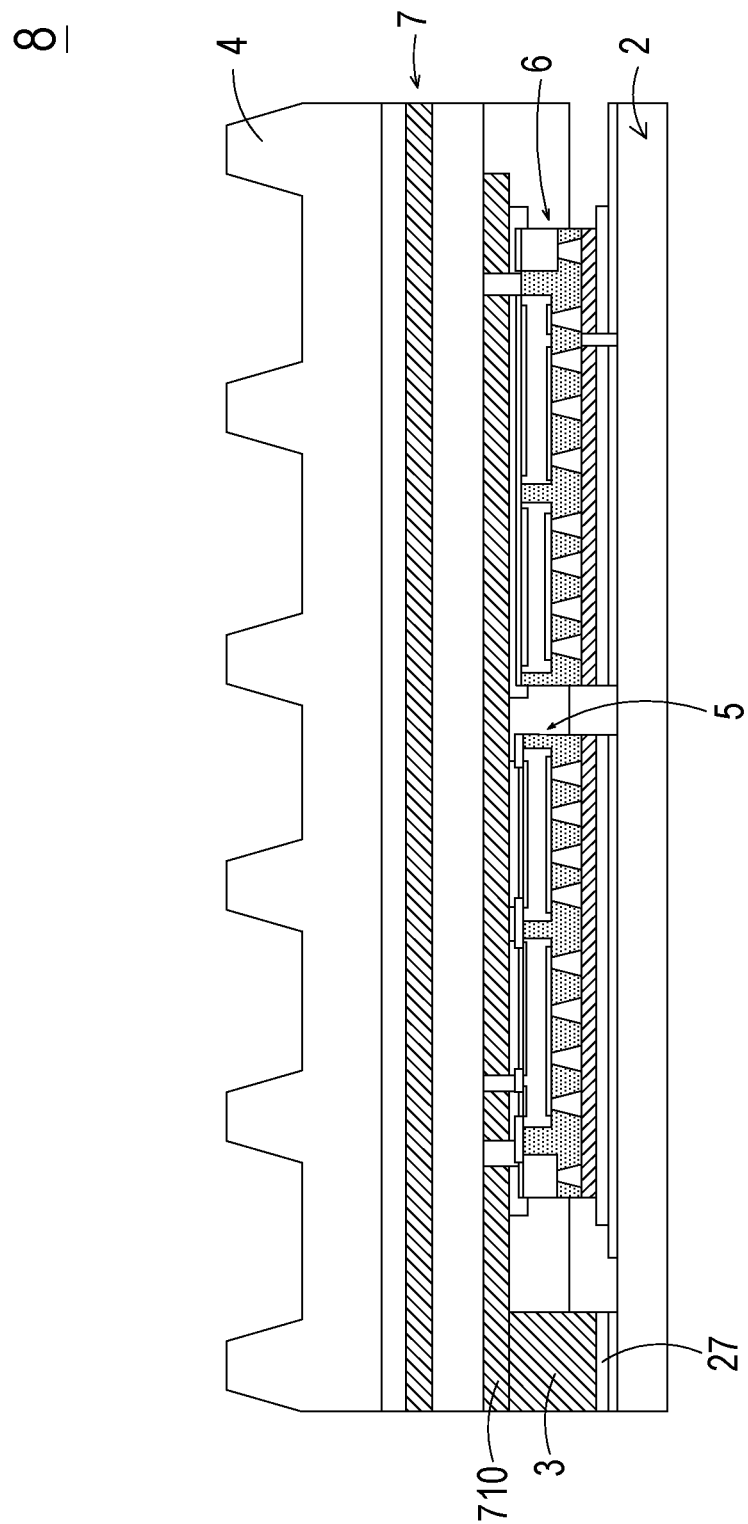
FIG. 6 is a schematic cross-sectional view illustrating a power module according to a second embodiment of the present invention.

FIG. 6 is a schematic cross-sectional view illustrating a power module according to a second embodiment of the present invention. In comparison with the power module 1 of FIG. 1, the conductive pin 3 of the power module 8 of this embodiment is not the individual pin. Instead, the conductive pin 3 is extended from the first conductive block 710. Similarly, the conductive pin 3 is fixed on the first conducting part 20 of the circuit board 2 through the conducting material 27.

Figure 7:
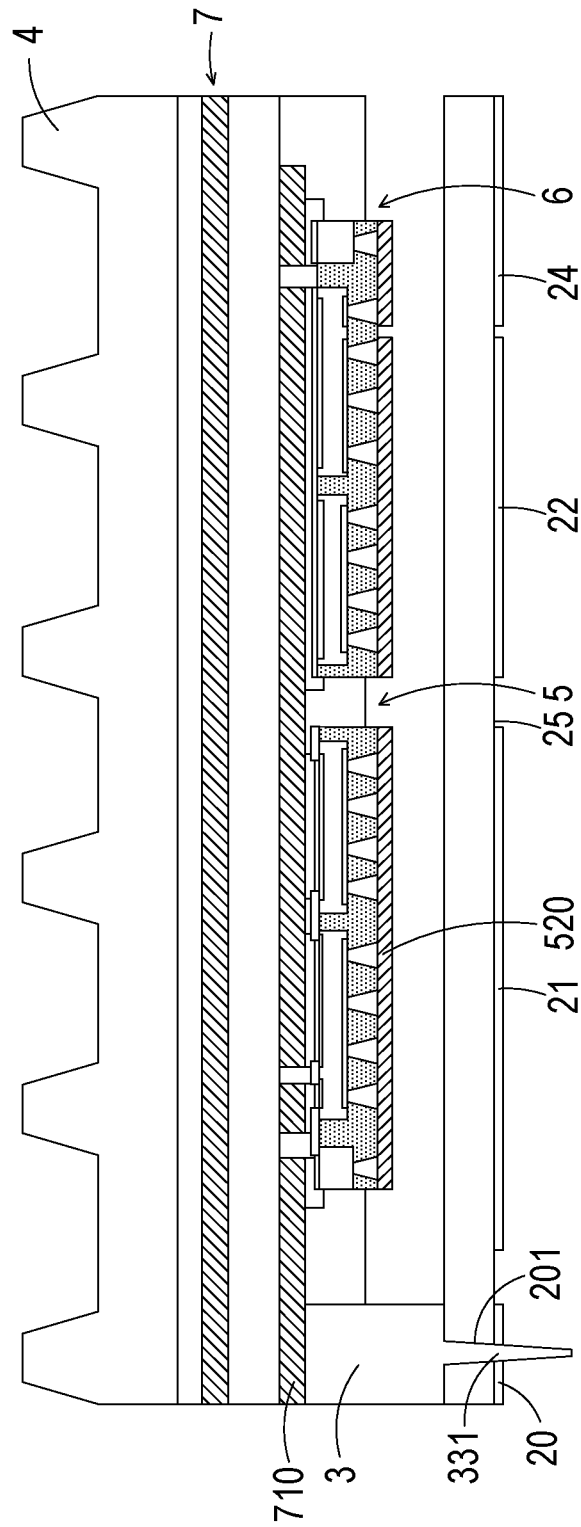
FIG. 7 is a schematic cross-sectional view illustrating a power module according to a third embodiment of the present invention.

FIG. 7 is a schematic cross-sectional view illustrating a power module according to a third embodiment of the present invention. In comparison with the power module 1 of FIG. 1, the conductive pin 3 of the power module 9 of this embodiment is not fixed on the first conducting part 20 of the circuit board 2 through the conducting material 27. Instead, a protrusion segment 331 of the conductive pin 3 is inserted into a corresponding insertion slot 201 of the circuit board 2. In the embodiment of FIG. 1, the first conducting part 20, the second conducting part 21, the third conducting part 22 and the fourth conducting part 24 are disposed on the first surface 23 of the circuit board 2. In this embodiment, the first conducting part 20, the second conducting part 21, the third conducting part 22 and the fourth conducting part 24 are disposed on a second surface 25 of the circuit board 2. The first conducting part 20 is aligned with the insertion slot 201. When the protrusion segment 331 of the conductive pin 3 is inserted into the insertion slot 201 of the circuit board 2, the first conducting part 20 is electrically connected with the protrusion segment 331 of the conductive pin 3. Consequently, the first conducting part 20 is electrically connected with the first electrode 520 through the conductive pin 3, the first conductive block 710 and the first thermal/electrical conduction structure 55. Moreover, when the protrusion segment 331 of the conductive pin 3 is inserted into the insertion slot 201 of the circuit board 2, the first sub-module 5 and the second sub-module 6 are separated from the circuit board 2 by a gap. Consequently, it is not necessary to solder the first sub-module 5 and the second sub-module 6 on the circuit board 2. It is noted that numerous modifications and alterations may be made while retaining the teachings of the invention. In another embodiment, when the protrusion segment 331 of the conductive pin 3 is inserted into the insertion slot 201 of the circuit board 2, the first sub-module 5 and the second sub-module 6 are attached on the circuit board 2.

From the above descriptions, the present invention provides the power module. The semiconductor switches and the diodes are embedded within insulation layers. Consequently, a first sub-module and a second sub-module are formed as a high-voltage-side switching element and a low-voltage-side switching element of a bridge circuit. The first sub-module and the second sub-module are disposed on a first surface of a substrate. An electrode of the first sub-module and some electrodes of the second sub-module are electrically connected with corresponding conducting parts of a circuit board. A heat sink is disposed on a second surface of the substrate. The heat of the power module can be dissipated away through the circuit board and the heat sink. Since the heat can be dissipated away in two directions, the heat dissipating efficiency is enhanced. Moreover, it is not necessary to embed substrates within the first sub-module and the second sub-module. That is, the first sub-module and the second sub-module are disposed on the substrate. Consequently, the process of packaging the power module of the present invention is simplified. Moreover, the first sub-module (i.e., the high-voltage-side switching element) and the second sub-module (i.e., the low-voltage-side switching element) are not connected with each other by the wire-bonded technology. Consequently the power module of the present invention has reduced parasitic inductance, increased switching efficiency, reduced impedance and increased power conversion efficiency.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
   a substrate comprising a first conductive layer disposed on a first surface and a second conductive layer disposed on a second surface opposite to the first surface, the first conductive layer comprising a plurality of conductive blocks, wherein the plurality of conductive blocks further comprises a first conductive block, a second conductive block, a third conductive block and a fourth conductive block;
   a first sub-module disposed on the first conductive layer, the first sub-module comprising a first semiconductor switch and a first diode which is connected in parallel with the first semiconductor switch, wherein the first sub-module further comprises a first electrode, a second electrode, a third electrode and a fourth electrode, and the third electrode is electrically connected with the third conductive block;
   a second sub-module disposed on the first conductive layer, the second sub-module comprising a second semiconductor switch and a second diode which is connected in parallel with the second semiconductor switch, the second semiconductor switch being electrically connected with the first semiconductor switch through the plurality of conductive blocks, wherein the second sub-module further comprises a fifth electrode, a sixth electrode and a seventh electrode, and the seventh electrode is electrically contacted with the third conductive block;
   a conductive pin disposed on the first conductive layer and electrically connected with at least one of the conductive blocks, wherein a first end of the conductive pin is electrically connected with the first conductive block;
   a circuit board disposed on the conductive pin and electrically connected with the first semiconductor switch and the second semiconductor switch through the conductive pin; and
   a heat sink disposed on the second conductive layer;
   wherein the first sub-module further comprises a first thermal/electrical conduction structure and a first lead electrode, and the second sub-module further comprises a second thermal/electrical conduction structure and a second lead electrode, wherein the first thermal/electrical conduction structure is arranged between the first electrode and the first lead electrode and electrically connected with the first electrode and the first lead electrode, wherein the second thermal/electrical conduction structure is arranged between the sixth electrode and the second lead electrode, and electrically connected with the sixth electrode and the second lead electrode, wherein the first lead electrode is electrically connected with the first conductive block.

2. The power module according to claim 1, wherein the first semiconductor switch comprises plural first conducting terminals, and the first diode comprises plural second conducting terminals, wherein the first electrode is electrically connected with the corresponding first conducting terminal of the first semiconductor switch and the corresponding second conducting terminal of the first diode, the second electrode and the third electrode are electrically connected with the corresponding first conducting terminals of the first semiconductor switch, and the fourth electrode is electrically connected with the corresponding second conducting terminal of the first diode, wherein the second electrode is electrically connected with the second conductive block, and the fourth electrode is electrically connected with the third conductive block.

3. The power module according to claim 2, wherein the second semiconductor switch comprises plural third conducting terminals, and the second diode comprises plural fourth conducting terminals, wherein the fifth electrode and the seventh electrode are electrically connected with the corresponding third conducting terminals of the second semiconductor switch and the corresponding fourth conducting terminal of the second diode, the sixth electrode is electrically connected with the corresponding third conducting terminal of the second semiconductor switch.

4. The power module according to claim 3, wherein the circuit board further comprises a first conducting part, a second conducting part, a third conducting part and a fourth conducting part, wherein the first conducting part, the second conducting part, the third conducting part and the fourth conducting part are disposed on a first surface of the circuit board, wherein the second conducting part is electrically connected with the first electrode, the third conducting part is electrically connected with the fifth electrode, and the fourth conducting part is electrically connected with the sixth electrode.

5. The power module according to claim 3, wherein the first semiconductor switch is an insulated-gate bipolar transistor, and the first semiconductor switch comprises three first conducting terminals, wherein the three first conducting terminals serve as a gate, an emitter and a collector, respectively, wherein the first electrode is electrically connected with the collector of the first semiconductor switch, the second electrode is electrically connected with the gate of the first semiconductor switch, and the third electrode is electrically connected with the emitter of the first semiconductor switch.

6. The power module according to claim 5, wherein the first sub-module further comprises:
 a first insulation layer, wherein plural first conductive vias and a second conductive via are formed in the first insulation layer;
 a first conductive layer disposed on a first surface of the first insulation layer, and comprising plural separation structures, wherein the first conductive layer is divided into the second electrode, the third electrode, the fourth electrode and the first lead electrode through the plural separation structures; and
 a second conductive layer disposed on a second surface of the first insulation layer, wherein the second conductive layer is contacted with first ends of the plural first conductive vias and contacted with a first end of the second conductive via.

7. The power module according to claim 6, wherein the first semiconductor switch and the first diode are embedded within the first insulation layer, wherein the first conducting terminal serving as the gate of the first semiconductor switch is electrically connected with the second electrode, the first conducting terminal serving as the emitter of the first semiconductor switch is electrically connected with the third electrode, and the first conducting terminal serving as the collector of the first semiconductor switch is contacted with the second ends of the corresponding first conductive vias so as to be electrically connected with the first electrode, wherein the second conducting terminal serving as an anode of the first diode is electrically connected with the fourth electrode, and the second conducting terminal serving as a cathode of the first diode is contacted with the second ends of the corresponding first conductive vias so as to be electrically connected with the first electrode.

8. The power module according to claim 6, wherein the first thermal/electrical conduction structure is embedded within the first insulation layer, and the first thermal/electrical conduction structure has a first surface and a second surface, wherein the first surface of the first thermal/electrical conduction structure is contacted with the first lead electrode, and the second surface of the first thermal/electrical conduction structure is contacted with a second end of the second conductive via so as to be electrically connected with the first electrode.

9. The power module according to claim 3, wherein the second semiconductor switch is an insulated-gate bipolar transistor, and the second semiconductor switch comprises three third conducting terminals, wherein the three third conducting terminals serve as a gate, an emitter and a collector, respectively, wherein the fifth electrode is electrically connected with the emitter of the second semiconductor switch, the sixth electrode is electrically connected with the gate of the second semiconductor switch, and the seventh electrode is electrically connected with the collector of the second semiconductor switch.

10. The power module according to claim 9, wherein the second sub-module further comprises:
 a second insulation layer, wherein plural third conductive vias and a fourth conductive via are formed in the second insulation layer;
 a third conductive layer disposed on a first surface of the second insulation layer, and divided into the seventh electrode and the second lead electrode; and
 a fourth conductive layer disposed on a second surface of the second insulation layer, wherein the fourth conductive layer is divided into the fifth electrode and the sixth electrode, wherein the fifth electrode and the sixth electrode are contacted with first ends of the plural third conductive vias, and the sixth electrode is further contacted with a first end of the fourth conductive via.

11. The power module according to claim 10, wherein the second semiconductor switch and the second diode are embedded within the second insulation layer, wherein the third conducting terminal serving as the emitter of the second semiconductor switch is contacted with second ends of the corresponding third conductive vias so as to be electrically connected with the fifth electrode, the third conducting terminal serving as the gate of the second semiconductor switch is contacted with the second end of the corresponding third conductive via so as to be electrically connected with the sixth electrode, and the third conducting terminal serving as the collector of the second semiconductor switch is electrically connected with the seventh electrode, wherein the fourth conducting terminal serving as an anode of the second diode is contacted with the second ends of the corresponding third conductive vias so as to be electrically connected with the fifth electrode, and the fourth conducting terminal serving as a cathode of the second diode is electrically connected with the seventh electrode.

12. The power module according to claim 10, wherein the second thermal/electrical conduction structure is embedded within the second insulation layer, and the second thermal/electrical conduction structure has a first surface and a second surface, wherein the first surface of the second thermal/electrical conduction structure is contacted with the second lead electrode, and the second surface of the second thermal/electrical conduction structure is contacted with a second end of the fourth conductive via so as to be electrically connected with the sixth electrode.

13. The power module according to claim 3, wherein the fourth conductive block of the substrate is electrically connected with the second lead electrode.

14. The power module according to claim 3, wherein the conductive pin is a pin.

15. The power module according to claim 3, wherein the conductive pin is extended from the first conductive block.

16. The power module according to claim 3, wherein the conductive pin has a protrusion segment, and the circuit board has an insertion slot corresponding to the protrusion segment, wherein the protrusion segment of the conductive pin is inserted into the insertion slot of the circuit board.

17. The power module according to claim 16, wherein a first conducting part is disposed on a second surface of the circuit board and aligned with the insertion slot, wherein when the protrusion segment of the conductive pin is inserted into the insertion slot, the first conducting part is electrically connected with the insertion slot.

18. The power module according to claim 17, wherein when the protrusion segment of the conductive pin is inserted into the insertion slot, the first sub-module and the second sub-module are separated from the circuit board by a gap.

* * * * *